(12) United States Patent
Wieczorek et al.

(10) Patent No.: US 6,281,086 B1
(45) Date of Patent: Aug. 28, 2001

(54) SEMICONDUCTOR DEVICE HAVING A LOW RESISTANCE GATE CONDUCTOR AND METHOD OF FABRICATION THE SAME

(75) Inventors: Karsten Wieczorek, Reichenberg-Boxdorf; Manfred Horstmann, Dresden; Tilo Mantei, Meissen, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/422,548

(22) Filed: Oct. 21, 1999

(51) Int. Cl.$^7$ ............... H01L 21/336; H01L 21/425; H01L 21/4763
(52) U.S. Cl. ............ 438/305; 438/529; 438/592
(58) Field of Search ............... 438/303, 305, 438/586, 592, 621, 529, 655, 664, 680; 257/382, 383, 384

(56) References Cited

U.S. PATENT DOCUMENTS

| | | | | |
|---|---|---|---|---|
| 5,937,319 | * | 8/1999 | Xiang et al. | 438/585 |
| 5,998,273 | * | 12/1999 | Ma et al. | 438/305 |
| 6,017,809 | * | 1/2000 | Inumiya et al. | 438/585 |
| 6,046,105 | * | 4/2000 | Kittl et al. | 438/655 |
| 6,069,032 | * | 5/2000 | Lee | 438/197 |
| 6,074,938 | * | 6/2000 | Asamura | 438/533 |
| 6,093,609 | * | 7/2000 | Chuang | 438/286 |
| 6,121,138 | * | 9/2000 | Wieczorek et al. | 438/682 |
| 6,127,267 | * | 10/2000 | Matsubara et al. | 438/656 |
| 6,156,615 | * | 12/2000 | Kepler | 438/305 |
| 6,174,762 | * | 1/2001 | Bronner et al. | 438/230 |

* cited by examiner

*Primary Examiner*—Michael Lebentritt
(74) *Attorney, Agent, or Firm*—Williams, Morgan & Amerson, P.C.

(57) ABSTRACT

A semiconductor device and a method of fabricating the same is provided, wherein the semiconductor device exhibits a lower gate delay time when compared to that of a conventional semiconductor device. The reduction of gate delay time is achieved by providing a conductive layer enclosing the gate electrode so as to significantly increase the surface portion of the gate electrode having a low electric resistance. For example, providing a substantially inverted U-shaped silicide layer enclosing the gate electrode leads to a decrease in the electrical resistance of about 67% with a given aspect ratio of about 1. Moreover, reducing the gate length, i.e., increasing the aspect ratio of the gate electrode results in a nearly complete independence of the gate resistance from the gate length.

13 Claims, 3 Drawing Sheets

SEMICONDUCTOR DEVICE HAVING A LOW RESISTANCE GATE CONDUCTOR AND METHOD OF FABRICATION THE SAME

BACKGROUND OF THE INVENTION

1. Field of the Invention

The present invention relates to integrated circuit devices, and, more particularly, to semiconductor devices having a gate electrode with improved electrical characteristics and method of making same.

2. Description of the Related Art

In the field of semiconductor integrated circuit devices, dimensions/sizes of design features are being steadily decreased for a variety of reasons. For example, design feature sizes are being decreased to achieve higher packaging densities for improving device performance, and to improve electrical performance characteristics of the semiconductor devices, such as a field effect transistor.

Complex digital circuits, such as central processing units (CPUs) and the like, demand fast switching transistors. All other things, being equal, the shorter the channel length of a transistor, the faster it will operate. Accordingly, there is a constant drive to reduce the channel-length on modern transistor devices. For example, the longitudinal dimension of a gate conductor of a transistor, i.e., the gate width, may extend to 20 $\mu$m, whereas the distance between the drain and source, ie., the channel length or gate length, may be reduced to 0.2 $\mu$m or below.

As the channel length has been reduced to obtain the desired switching characteristic, the length of the gate electrode has also been reduced. Since the gate electrode may only be electrically connected at one end, the electrical charges used to establish a transverse electrical field for forming the channel between the drain region and the source region of the transistor have to be transported along the entire width of the gate electrode. Given the small transverse dimension (length) of the gate electrode, the electrical resistance is relatively high which may result in higher RC-delay time-constants. Hence, generation of the transverse electrical field used to fully open the channel is delayed, thereby deteriorating the switching time of the transistor. As a consequence, the rise and fall times of the electrical signals are increased and the operating frequency, i.e., the clock frequency, is reduced. Thus, the a switching time of the transistor is no longer limited by the drain and source characteristics, but rather significantly depends on the delay associated with signal propagation along the gate electrode, i.e., the transistor performance depends, at least in part, on the resistance of the gate electrode in the longitudinal direction of the gate electrode, i.e., in the gate width direction.

One illustrative prior art device and process for forming a gate electrode, and a conductive layer in contact with the gate electrode of such a device, will be explained with reference to various cross-sectional views of an illustrative MOS transistor in various stages of the fabrication process as depicted in FIGS. 1A–1D. As shown in FIG. 1A, shallow trenches 2 are formed in a semiconductor substrate 1 to define an active region 30. Thereafter, a gate dielectric layer 3 consisting of, for example, silicon dioxide ($SiO_2$) is formed on the semiconductor substrate 1 between the shallow trenches 2. A polycrystalline silicon layer (not shown) may then be blanket-deposited over the semiconductor substrate 1 and gate dielectric layer 3 and, subsequently, patterned using traditional photolithography and etching processes to define a gate electrode 4 over the gate dielectric layer 3. The gate electrode 4 has a top surface 4A. In this embodiment, the gate dielectric layer 3 is used as an etch stop layer although that is not required.

FIG. 1B is a cross-sectional view of the illustrative prior art transistor at the stage where a portion of the gate dielectric layer 3, extending beyond the gate electrode 4, has been removed by traditional etching processes. Moreover, a plurality of dielectric sidewall spacers 5 have been formed adjacent the gate electrode 4 after a first light-dosage dopant implantation step is performed to form lightly doped source and drain regions 6, ie., the source/drain extensions. Thereafter, in a further dopant implantation step, highly doped drain and source regions 7 having a surface 7A are formed. The drain and source regions may also be subjected to a subsequent rapid thermal annealing (RTA) step.

Next, as shown in FIG. 1C, a layer 8 comprised of a refractory metal may be blanket-deposited over the structure shown in FIG. 1B. The layer 8 may be comprised of any suitable refractory metal, such as titanium (Ti), cobalt (Co), nickel (Ni), platinum (Pt) or the like. Prior to the formation of the layer 8, the substrate may be cleaned to remove any residual material, e.g., oxides, from the surfaces 4A, 7A of the gate electrode 4 and the drain and source regions 7. Next, the structure may be subjected to a heating process, e.g., a rapid thermal anneal (RTA) process, at low temperatures to form an initial silicide phase on the surfaces 7A of the drain and source regions 7 and on the surface 4A of the gate electrode 4. Any portion of the metal layer 8 that is not converted into a metal silicide may be removed by selective wet etching. In a further RTA-treatment, at a higher temperature, the silicide formed on the surfaces 4A, 7A is transformed into a low ohmic phase to reduce the respective contact resistances. During the process of forming the metal silicide, some portion of the gate conductor 4 and the drain and source regions 7 may be consumed.

FIG. 1D is a cross-sectional view of the illustrative transistor fabricated as described above with a gate contact silicide 9 formed on the gate electrode 4, and metal silicide contacts 15 over the drain and source regions 7. The width of the gate electrode 4 for the transistor shown in FIG. 1D may extend for distances to, for example, 20 $\mu$m in the direction perpendicular to the drawing plane of FIG. 1D, i.e., into the drawing. An electrical connection with a gate wiring line is usually provided only at one end portion the gate electrode 4. The resistance of the gate electrode 4 in the gate width directions depends, in part, on the cross-sectional area of the gate contact silicide 9 illustrated in FIG. 1D. As the length of the gate conductor, i.e., the dimension of the gate electrode in the source-drain-direction, is decreased due to efforts to reduce the size of the transistor and increase its performance, the gate resistance increases linearly, thereby causing deteriorated signal performance.

The present invention is directed to a semiconductor device that solves, or at least reduces, some or all of the aforementioned problems, and a method of making such a device.

SUMMARY OF THE INVENTION

The present invention is generally directed to semiconductor devices having a gate electrode with improved electrical characteristics and a method of making same. In one illustrative embodiment, the method comprises providing a semiconducting substrate, forming a gate electrode above the substrate, the gate electrode having a top surface and a plurality of side surfaces, and forming a metal silicide layer on the top surface of the gate electrode and along at least a portion of the side surfaces of the gate electrode.

One illustrative embodiment of a semiconductor device in accordance with the present invention is comprised of a semiconducting substrate and a gate electrode positioned above the substrate, the gate electrode having a top surface and a plurality of said surfaces. The device further comprises a metal silicide layer positioned above the top surface of the gate electrode and along at least a portion of the side surfaces of the gate electrode, and a plurality of source/drain regions.

BRIEF DESCRIPTION OF THE DRAWINGS

The invention may be understood by reference to the following description taken in conjunction with the accompanying drawings, in which like reference numerals identify like elements, and in which.

Figure 1A:
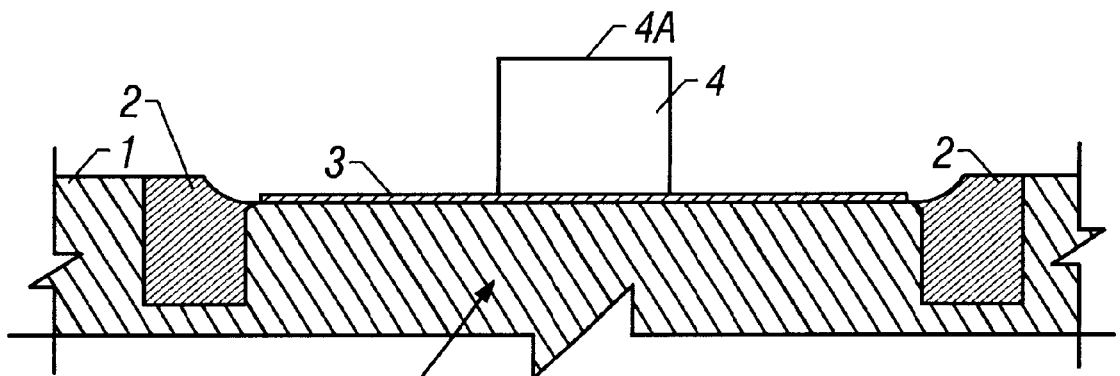
FIGS. 1A–1D are cross-sectional views of a prior art semiconductor device during various stages of fabrication.
Figure 1B:
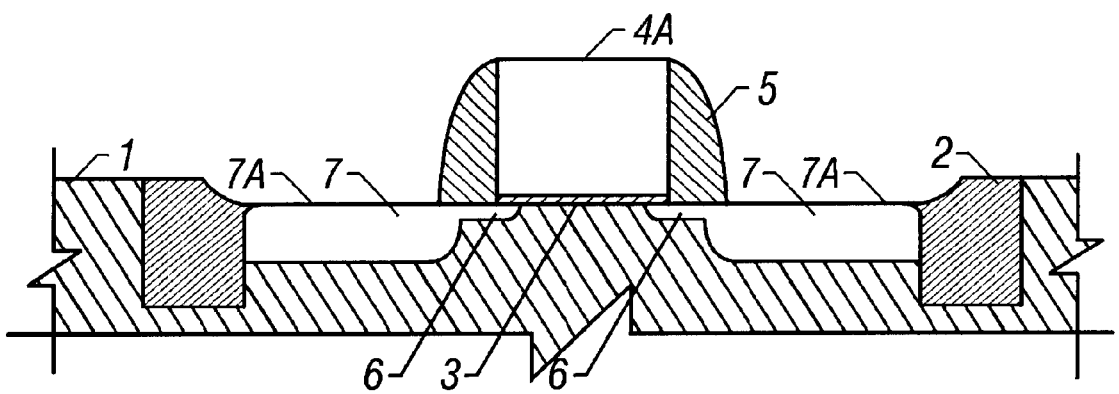
Figure 1C:
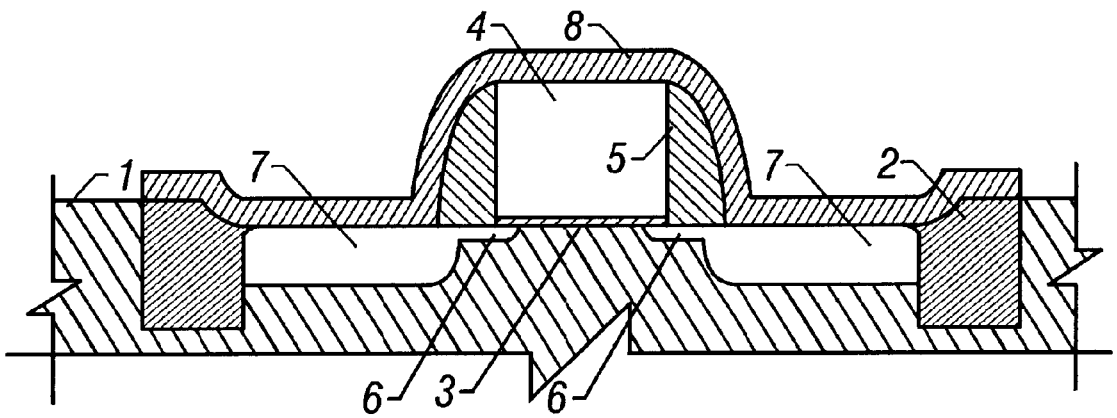
Figure 1D:
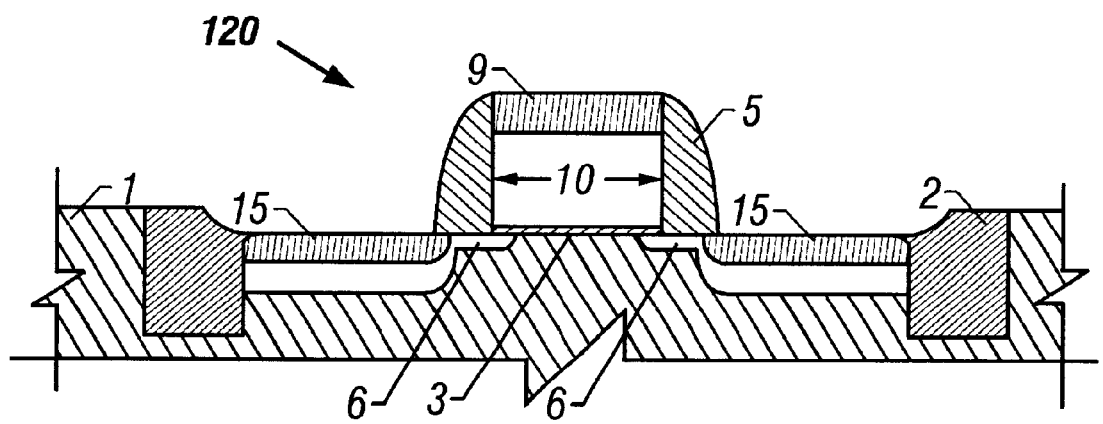

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2a–2e. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a semiconductor device having a low resistance gate electrode, and a method of making same. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 2A:
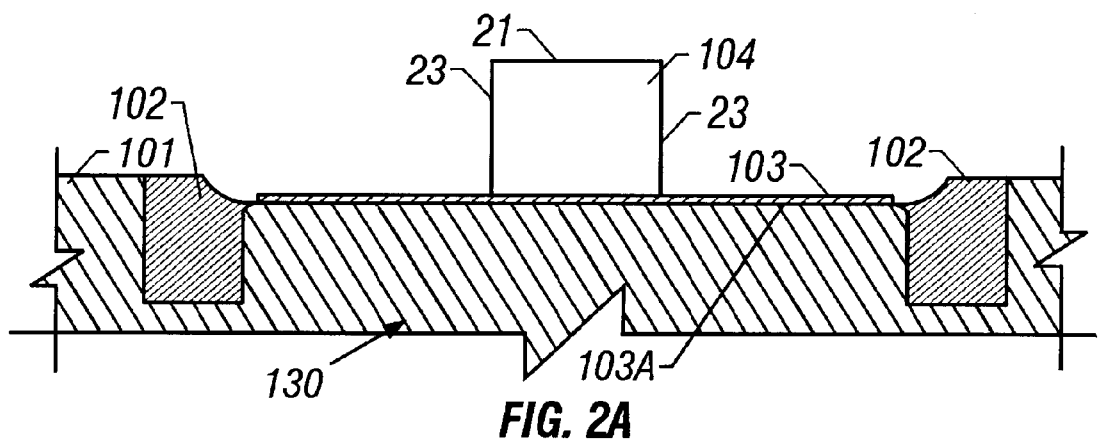
FIGS. 2A–2E are cross-sectional views of a semiconductor device in accordance with one illustrative embodiment of the present invention.

FIGS. 2A–2E are cross-sectional views of a transistor in various stages of the fabrication process in accordance with one illustrative embodiment of the present invention. In FIG. 2A, shallow trenches 102 are formed in a semiconductor substrate 101 and filled with a dielectric material 102A to define an active area 130 of the transistor 120. A gate dielectric layer 103 is then formed above the semiconductor substrate 101. The gate dielectric layer 103 may be comprised of a variety of materials, such as silicon dioxide, silicon oxynitride, etc., and it may be formed by a variety of techniques, such as thermal growing, deposition, etc.

A gate electrode 104 is then formed above the gate dielectric layer 103 using a variety of techniques, such as the illustrative process flow described with reference to FIG. 1A. The gate electrode 104 has a top surface 21 and a plurality of side surfaces 23. Of course, the present invention is not limited to any particular geometric shape of the gate electrode 104. The gate electrode 104 may be comprised of a variety of materials, such as polysilicon.

Figure 2B:
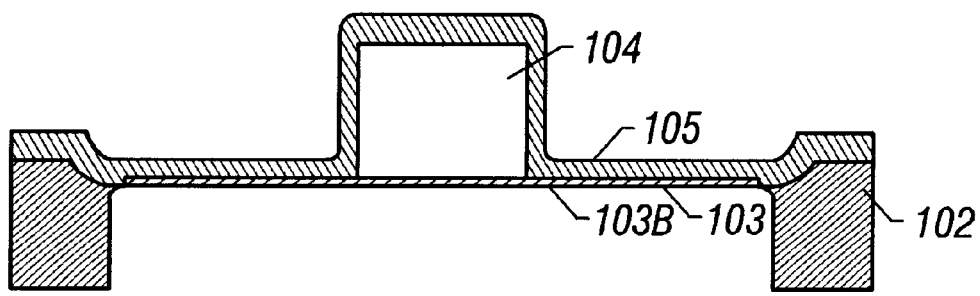

Next, as shown in FIG. 2B, a refractory metal layer 105, e.g., cobalt, titanium, platinum, etc., is blanket-deposited over the structure depicted in FIG. 2A. A low-temperature RTA treatment may then be performed to form a metal silicide layer, e.g., a cobalt-silicide layer, where the refractory metal layer 105 is in contact with the polycrystalline silicon gate electrode 104. The gate dielectric layer 103 prevents the refractory metal layer 105 from coming in contact with portions 103A of the substrate 101 beneath the gate dielectric layer 103.

Figure 2C:
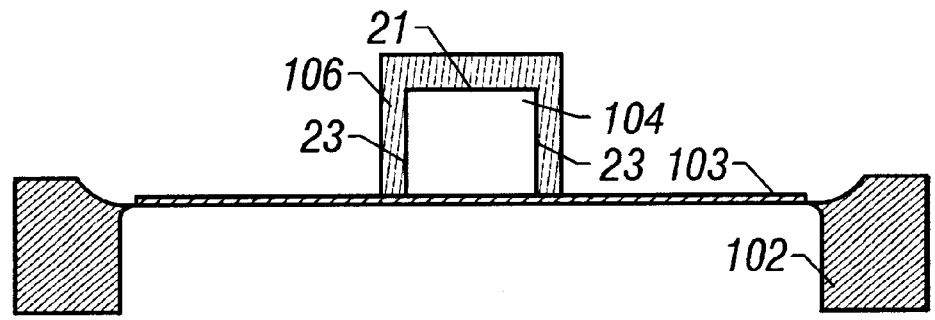

In FIG. 2C, the resulting structure is shown after the unreacted refractory metal is removed. Through this process, a conductive layer 106 comprised of a metal silicide, for example, cobalt silicide, is formed over the exposed top surface 21 and the side surfaces 23 of gate electrode 104. In the depicted embodiment, the conductive layer 106 has a substantially inverted U-shaped cross-section that covers the top and side surfaces 21, 23 of the gate electrode 104 and it extends along the width of the gate electrode 104. In the embodiment depicted in FIG. 2C, portions of the conductive layer 106 are in contact with portions of the gate dielectric layer 103 that extend beyond the side surfaces 23 of the gate electrode 104. Of course, the conductive layer 106 may not completely cover the side surfaces 23 of the gate electrode 104. For example, to provide better protection against electrical breakdown, the side surfaces 23 of the gate electrode 104 may, for example, not be entirely covered by the conductive layer 106, thus leaving a space (not shown) between the conductive layer 106 on the side surfaces 23 and the gate dielectric layer 103.

Figure 2D:
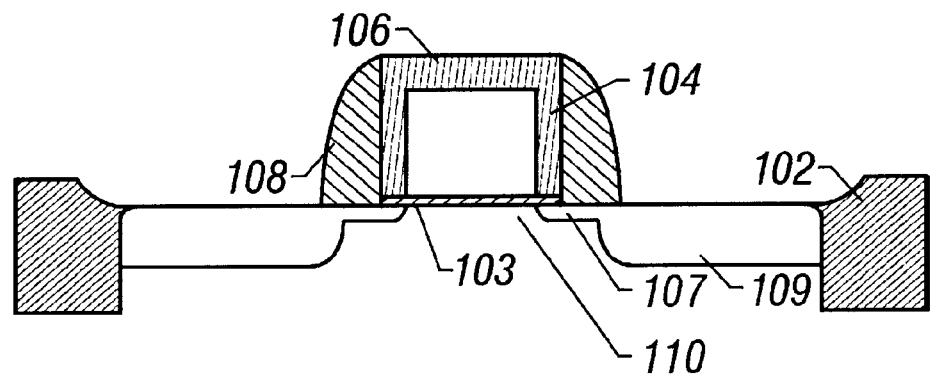

Next, as shown in FIG. 2D, portions of the gate dielectric layer 103 extending beyond the conductive layer 106 are removed using one or more traditional etching processes. An ion implantation process with a light dose of dopants may then be performed to form lightly doped drain areas 107. Subsequently, a plurality of sidewall spacers 108 are formed by blanket-depositing a layer of the appropriate material, e.g., silicon dioxide ($SiO_2$) or silicon nitride ($Si_3N_4$), and subjecting the layer to an anisotropic etching process. Thereafter, a further ion implantation step is performed to form highly doped drain and source regions 109, wherein the sidewall spacers 108 act as an implantation mask. A low-temperature RTA step connects the lightly doped drains 107 and the heavily doped drain and source regions 109.

Figure 2E:
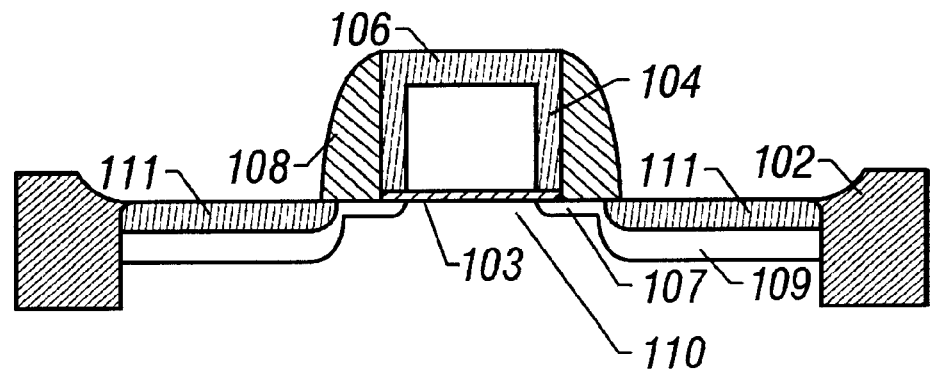

Next, as shown in FIG. 2E, a further silicidation step is performed on the transistor structure to produce metal silicide contacts 111 on the drain and source regions 109 by conventional salicidation processing. The metal silicide contacts 111 may be comprised of any metal silicide, e.g., cobalt silicide, titanium silicide, etc.

The semiconductor device in accordance with the present invention exhibits a reduced resistance in the direction of the width of the gate electrode 104, as compared to a corresponding conventional semiconductor device. This is due, at least in part, to the fact that a conventional device only has a conductive silicide layer on the top surface 21 of the gate electrode 104, while, according to the present invention, the conductive layer 106, e.g., a silicide layer, additionally covers, at least partially, the side surfaces 23 of the gate electrode 104. In one illustrative embodiment, the gate electrode 104 covered with the inverted U-shaped conducting layer 106 may extend up to 20 $\mu$m along the entire width of the gate electrode (in a direction perpendicular to the drawing plane of FIGS. 2A–2E).

In operation, a gate voltage is supplied to one end portion of the gate electrode 104. With a given aspect ratio of the gate electrode 104 of about 1, as shown in FIG. 2E, the gate contact layer resistance will drop by about 67% when compared to a conventional transistor having the same feature sizes. This is due, in part, to the fact that the conductive layer 106 covering the gate electrode 104 in the present transistor has a cross-sectional area along the direction perpendicular to the gate width that is approximately three times that of a conventional device. Moreover, since transportation of the charge carriers occurs substantially in the conductive layer 106, the effective gate resistance may be substantially decoupled from the gate length due to the predominant effect of the sidewall conductivity of the conducting layer 106 when, for example, design requirements demand a further reduced gate length, contact layer resistance is no longer affected thereby. Accordingly, the transistor in accordance with the present invention comprising the conductive layer 106, which significantly increases the overall area of highly conductive portions of the gate electrode 104, exhibits a decrease in the delay of fully biasing the gate electrode 104. Thus, building up the transverse electrical field along the entire width of the gate 104 is significantly accelerated. Consequently, transistors having a structure in accordance with the present invention and fabricated in conformity with the method described herein exhibit improved signal performance and lower power consumption due to the reduced gate contact resistance.

In the illustrative embodiment described above, the lightly doped drains 107 have been formed after removing the gate dielectric layer 103 extending beyond the conductive layer 106. It is also possible, however, to form thin additional spacers before removing the gate dielectric layer 103 to improve the resistance of the transistor with respect to electrical breakdown and short circuiting of the conductive layer 106 to the underlying lightly doped drains 107. The lightly doped drains 107 may then be formed by ion implantation with a light dose of dopant, e.g., $5 \times 10^{13} - 1 \times 10^{16}$ ions per square centimeter, and a subsequent rapid thermal annealing step with a temperature ranging from 900–1100° C. to drive the dopant ions into that portion of the substrate that is underlying the additional spacers. The highly doped drain and source regions 109 may then be formed by a subsequent ion implantation process using a higher implant dosage, e.g., $1 \times 10^{15} - 1 \times 10^{16}$ ions per square centimeter, and thereafter performing a rapid thermal anneal step with a temperature ranging from 900–1100° C.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the present invention. It is to be understood that the form of the invention shown and described herein is to be taken as the presently preferred embodiment. Elements and materials may be substituted for those illustrated and described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

providing a semiconducting substrate;

forming a gate dielectric layer above said substrate;

forming a gate electrode above said gate dielectric layer, said gate electrode having a top surface and a plurality of side surfaces; and forming a metal silicide layer on said top surface and along at least a portion of said side surfaces of said gate electrode, the metal silicide layer on said side surfaces of said gate electrode being positioned above and in contact with said gate dielectric layer extending beyond said side surfaces of said gate electrode.

2. The method of claim 1, wherein forming a gate electrode above said gate dielectric layer, said gate electrode having a top surface and a plurality of side surfaces comprises:

depositing a layer of a gate electrode material and patterning the layer to define a gate electrode.

3. The method of claim 1, wherein forming a gate electrode above said gate dielectric layer, said gate electrode having a top surface and a plurality of side surfaces comprises:

depositing a layer of polysilicon and patterning the layer of polysilicon to define a gate electrode.

4. The method of claim 1, wherein forming a metal silicide layer on said top surface and along at least a portion of said side surfaces of said gate electrode, the metal silicide layer on said side surfaces of said gate electrode being positioned above and in contact with said gate dielectric layer extending beyond said side surfaces of said gate electrode comprises:

depositing a layer comprised of a refractory metal above said top surface and along at least a portion of said side surfaces of said gate electrode; and performing at least one anneal process to convert at least a portion of said refractory metal layer to a metal silicide.

5. The method of claim 1, wherein forming a metal silicide layer on said top surface and along at least a portion of said side surfaces of said gate electrode, the metal silicide layer on said side surfaces of said gate electrode being positioned above and in contact with said gate dielectric layer extending beyond said side surfaces of said gate electrode comprises:

depositing a refractory metal layer comprised of at least one of cobalt, titanium, platinum, and nickel above said top surface and along at least a portion of said side surfaces of said gate electrode; and performing at least one anneal process to convert at least a portion of said refractory metal layer to a metal silicide.

6. The method of claim 1, wherein forming a metal silicide layer on said top surface and along at least a portion of said side surfaces of said gate electrode, the metal silicide layer on said side surfaces of said gate conductor being positioned above and in contact with said gate dielectric layer extending beyond said side surfaces of said gate electrode comprises forming a metal silicide layer on said top surface and along substantially all of said side surfaces of said gate electrode, the metal silicide layer on said side surfaces of said gate electrode being positioned above and in contact with said gate dielectric extending beyond said side surfaces of said gate electrode.

7. The method of claim 1, further comprising:

forming a plurality of source/drain regions in said substrate adjacent said gate electrode; and forming metal silicide contacts on said source/drain regions.

8. A method, comprising:

providing a semiconducting substrate;

forming a gate dielectric layer above said substrate;

forming a gate electrode above the gate dielectric layer, said gate electrode having a top surface and a plurality of side surfaces;

forming a refractory metal layer above said gate dielectric layer and on said top surface and on substantially all of said side surfaces of said gate electrode;

converting at least a portion of said refractory metal layer on said top surface and said side surfaces of said gate electrode into a metal silicide;

forming a sidewall spacer adjacent to said metal silicide on said side surfaces of said gate electrode;

performing an initial ion implantation process with a light concentration of dopant atoms before said sidewall spaces are formed to form a lightly doped region in said substrate;

performing a second ion implantation process with a higher concentration of dopant atoms; and, performing at least one anneal process to form source/drain region in said substrate.

9. The method of claim 8, wherein forming a gate dielectric layer above said substrate comprises forming a gate dielectric layer and comprised of silicon dioxide above said substrate.

10. The method of claim 8, wherein forming a gate dielectric layer above said substrate comprises thermally growing a gate dielectric layer comprised of silicon dioxide above said substrate.

11. The method of claim 8, wherein forming a gate electrode above the gate dielectric layer, said gate electrode having a top surface and a plurality of side surfaces comprises forming a gate electrode comprised of polysilicon above the gate dielectric layer, said gate electrode having a top surface and a plurality of side surfaces.

12. The method of claim 8, wherein forming a refractory metal layer above said gate dielectric layer and on said top surface and on substantially all of said side surfaces of said gate electrode comprises forming a refractory metal layer comprised of at least one of cobalt, titanium, nickel and platinum above said gate dielectric layer and on said top surface and on substantially all of said side surfaces of said gate electrode.

13. The method of claim 8, wherein converting at least a portion of said refractory metal layer on said top surface and said side surfaces of said gate electrode into a metal silicide comprises performing at least one anneal process on said refractory metal layer.

* * * * *